United States Patent
Lee et al.

(10) Patent No.: US 8,841,756 B2
(45) Date of Patent: Sep. 23, 2014

(54) FABRICATION OF OPTICAL-QUALITY FACETS VERTICAL TO A (001) ORIENTATION SUBSTRATE BY SELECTIVE EPITAXIAL GROWTH

(75) Inventors: Seung-Chang Lee, Albuquerque, NM (US); Steven R. J. Brueck, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 323 days.

(21) Appl. No.: 12/200,139

(22) Filed: Aug. 28, 2008

(65) Prior Publication Data

US 2008/0315370 A1   Dec. 25, 2008

Related U.S. Application Data

(62) Division of application No. 11/326,431, filed on Jan. 6, 2006, now Pat. No. 7,432,161.

(60) Provisional application No. 60/641,785, filed on Jan. 7, 2005.

(51) Int. Cl.
*H01L 29/04* (2006.01)
*H01L 21/02* (2006.01)
*H01L 33/00* (2010.01)
*H01S 5/02* (2006.01)

(52) U.S. Cl.
CPC .... *H01L 21/02642* (2013.01); *H01L 21/02609* (2013.01); *H01L 21/02387* (2013.01); *H01L 33/007* (2013.01); *H01S 5/0205* (2013.01); *H01L 21/02373* (2013.01); *H01L 21/02433* (2013.01)

USPC .................. 257/627; 257/E33.023; 438/479; 438/481

(58) Field of Classification Search
USPC ..................... 257/97, E33.023; 438/481–489
See application file for complete search history.

(56) References Cited

U.S. PATENT DOCUMENTS

| | | | | |
|---|---|---|---|---|
| 5,294,565 A | * | 3/1994 | Shiraishi | 117/95 |
| 5,591,666 A | * | 1/1997 | Shiralagi et al. | 117/90 |
| 6,802,902 B2 | * | 10/2004 | Beaumont et al. | 117/95 |
| 7,122,449 B2 | | 10/2006 | Langdo et al. | |
| 2001/0016387 A1 | | 8/2001 | Derraa | |
| 2001/0026006 A1 | | 10/2001 | Noble et al. | |
| 2004/0256639 A1 | | 12/2004 | Ouyang et al. | |
| 2007/0141763 A1 | | 6/2007 | Choi et al. | |

OTHER PUBLICATIONS

Journal of Applied Physics, vol. 90, No. 1, Jul. 1, 2001.*

(Continued)

*Primary Examiner* — Matthew W Such
*Assistant Examiner* — Ali Naraghi
(74) *Attorney, Agent, or Firm* — MH2 Technology Law Group, LLP

(57) ABSTRACT

Methods for forming {110} type facets on a (001) oriented substrate of Group III-V compounds and Group IV semiconductors using selective epitaxial growth is provided. The methods include forming a dielectric film on a (100) substrate. The dielectric film can then be patterned to expose a portion of the substrate and to form a substrate-dielectric film boundary substantially parallel to a <110> direction. A {110} type sidewall facet can then be formed by epitaxially growing a semiconductor layer on the exposed portion of the substrate and the dielectric film.

8 Claims, 6 Drawing Sheets

(56) References Cited

OTHER PUBLICATIONS

Nataf et al (selective growth of GaAs and AlgaAs on GaAs patterned substrate by HCl assisted low pressure metalorganic vapor phase epitaxial, Journal of crystal growth 165 (1996) 1-7).*

Gil-Lafon et al ((Selective growth of GaAs by HVPE: Keys for accurate control of the growth morphologies), Journal of Crystal Growth 222 (2001) 482-496).*

Gil-Lafon et al (Journal of Crystal growth 222 (2001), pp. 482-496).*

Isotropic/anisotropic growth behavior and faceting morphology of Si epitaxial layer selectively grown by cold wall ultrahigh vacuum chemical vapor deposition, J.Vac.Sci. Technol.B 22(1), Jan./Feb. 2004.*

Ispotropic/anistropic growth behavior and faceting morphology of Si epitaxial layer selectively grown by cold wall ultrahigh vacuum chemical vapor depositon J.Vac. Sci. Technol.B 22(1).*

Gil-Lafon et al (Journal of Crystal Growth 222 (2001) 482-496).*

Lee et al., "Faceting of a quasi-two-dimensional GaAs crystal in nanoscale patterned growth," Applied Physics Letters, 92, pp. 023103-1 through 023103-3 (2008).

Huang et al., "LOCOS-Induced Stress Effects on Thin-Film SOI Devices," IEEE Transactions on Electron Devices, vol. 44, No. 4, Apr. 1997, pp. 646-650.

* cited by examiner

FABRICATION OF OPTICAL-QUALITY FACETS VERTICAL TO A (001) ORIENTATION SUBSTRATE BY SELECTIVE EPITAXIAL GROWTH

CROSS-REFERENCE TO RELATED APPLICATIONS

This application is a division of U.S. patent application Ser. No. 11/326,431 filed on Jan. 6, 2006, now U.S. Pat. No. 7,432,161 which claims priority from U.S. Provisional Patent Application Ser. No. 60/641,785, filed Jan. 7, 2005, which is hereby incorporated by reference in its entirety.

GOVERNMENT INTEREST

This invention was developed with Government support under Contract No. MDA972-00-1-0024 from the Department of Defense/Defense Advanced Research Projects Agency. The U.S. Government has certain rights in this invention.

FIELD OF THE INVENTION

The present invention relates to semiconductor devices and their fabrication and, more particularly, to epitaxial growth of structures with vertical facets perpendicular to a (001) orientation substrate of Group III-V compound and/or Group IV semiconductors.

BACKGROUND OF THE INVENTION

In planar integrated photonics, spatially periodic structures are very useful for manipulating optical propagation. Often, this requires high-aspect-ratio features defined by surfaces perpendicular to a substrate. For example, semiconductor laser diodes, especially in-plane (or edge-emitting) laser diodes, are key components of many optical/optoelectronic integrated circuits. Currently, the material- and structure-dependent lasing wavelength extends from 300 nm to longer than 10 µm and emission power greater than 1 kW for high power and 1 W for coupling to single mode optical fibers are available from compound semiconductor technology. This lasing performance is achieved using a Fabry-Perot optical resonator that is bounded by cavity mirrors perpendicular to the gain length. Typically these are perpendicular to the substrate surface for in-plane laser diodes.

Semiconductor lasers require high optical quality mirrors for good device performance. Conventional methods for making these mirrors require cleaving of a substrate. In a (001) oriented semiconductor substrate, cleaving is along a <110> direction and provides reflectivity of about 0.3-0.4 without additional coatings. However, this is not compatible with integration processes because it involves separating a large wafer into many small pieces, each of which must be carefully handled and integrated with other components.

Another conventional method for mirror fabrication for integrated circuits is chemical etching using either wet or dry etching processes. But an etched surface is generally not perfectly vertical to the substrate and is not atomically flat. This results in light scattering losses that are detrimental to the lasing process. For integration of laser diodes into a large scale optical/optoelectronic integrated circuit, a process that can overcome these problems is required.

Thus, there is a need to overcome these and other problems of the prior art and to provide a method to fabricate mirror facets on a substrates of Group III-V compounds and/or Group IV semiconductors compatible with photonic integration processes.

SUMMARY OF THE INVENTION

According to various embodiments, a method for making a semiconductor device is provided. The method can include forming a dielectric film on a substrate, wherein the substrate has a (001) orientation. The dielectric film can be patterned to expose a portion or portions of the substrate, wherein at least a substrate-dielectric film boundary is substantially parallel to a <110> direction. An epitaxial layer can be formed including a sidewall oriented vertical to the substrate, wherein the layer is formed by epitaxial growth and the sidewall has an {110} orientation.

According to various embodiments, a semiconductor device is provided. The semiconductor device can include a substrate, wherein the substrate has an (001) orientation and an epitaxial layer including at least a first vertical sidewall is epitaxially grown atop the substrate, wherein the vertical sidewall has an {110} orientation.

According to various embodiments, another method for making a semiconductor device is provided. The method can include providing a substrate, wherein the substrate has a (001) orientation and depositing a dielectric film on the substrate. The dielectric film can be patterned to create an opening that exposes a portion of the substrate, wherein one or more boundaries of the opening are substantially parallel to a [110] direction. A laser structure can then be formed comprising a laser cavity on the exposed portion of the substrate, wherein the laser cavity comprises an epitaxially formed facet at each of two opposing ends of the laser cavity that serve as laser cavity mirrors.

According to various embodiments, still other methods for making a semiconductor device are provided. The method can include providing a substrate, wherein the substrate has a (001) orientation and depositing a dielectric film on the substrate. The dielectric film can be patterned to form at least two stripes that expose at least two portions of the substrate, wherein the at least the outer edge of each stripe is substantially parallel to a [110] direction. A vertically faceted epitaxial layer can be formed on each of the at least two stripes, wherein the outer edge of each of the vertically faceted epitaxial layers has an {110} orientation and these edges form laser cavity mirrors. A second dielectric film can be deposited on the patterned dielectric film and the vertically faceted epitaxial layers. The dielectric film deposited between the vertically faceted epitaxial layers can then be removed and a laser structure can be epitaxially grown between the vertically faceted epitaxial layers, wherein the laser structure comprises an active layer grown between two cladding layers.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
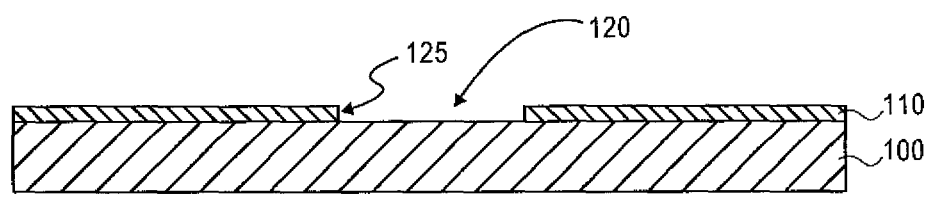
FIG. 1 depicts a cross sectional view of a dielectric film patterned in a <110> direction on a (001) oriented substrate in accordance with various embodiments of the present teachings.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

As depicted in FIGS. 1-6E, the present teachings relate to fabrication techniques for epitaxially growing {110} oriented sidewalls/facets compatible with integration processes. Formation of {110} oriented sidewalls/facets can be applicable across length scales ranging from centimeters to nanometers. These sidewalls/facets can be vertical with respect to a (001) oriented substrate in the nanoscale regime and have significant advantages for semiconductor devices. The disclosed methods are a directed self-assembly process using 'top-down' pattern definition to drive 'bottom-up' self-assembly.

Realization of short-cavity laser diodes can allow higher device density per chip by reducing cavity length, higher speed by lowering parasitic capacitances, and lower heat generation by decreasing threshold current. In fabrication of, for example, grating structures, the "bottom-up" process relying on the present teachings can provide greater degrees of freedom in design, such as a higher aspect ratio with better surface smoothness than etching processes in sub-nanoscale period patterns. The present teachings can be applicable not only to compound semiconductor laser diodes but also to Group IV semiconductor grating structures for photonics.

As used herein, (l m n) notation refers to a plane, {l m n} notation refers to a family of planes, [l m n] notation refers to a crystallographic direction, and <l m n> notation refers to one or more equivalent directions.

Also, as used herein, the term "(l m n) oriented" substrate or layer is used interchangeably with the term "(l m n)" substrate or layer and refers to a substrate or layer having its (l m n) planes oriented parallel to a surface of the substrate or layer. For example, a (001) substrate is used interchangeably with a (001) oriented substrate and refers to a substrate having its (001) planes oriented parallel to a substrate surface.

As used herein, the term "sidewall" refers to a surface of a structure adjacent but not parallel to the substrate. The term "facet," as used herein refers to any epitaxially formed, crystallographic surface of the structure. Thus, a sidewall can be a facet of the structure, such as, for example, a sidewall facet.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

According to various embodiments, the present teachings provide methods for forming {110} oriented facets that can be vertical to a (001) oriented substrate surface, aligned along a <110> direction (e.g., the [110] or [$\overline{1}\overline{1}0$] direction) and substantially atomically flat.

Exemplary methods for fabricating {110} oriented facets compatible with integration processes in accordance with various embodiments of the invention will now be described. Referring to FIG. 1, a dielectric film 110 can be formed on a (001) oriented substrate 100. According to various embodiments, the thickness of dielectric film 110 can be considerably smaller than that of a device structure. For example, the thickness can be about 100 nm or less. In an exemplary embodiment, substrate 100 can comprise a Group III-V compound and/or a Group IV semiconductor, for example, GaAs. Dielectric film 110 can comprise $SiO_2$, $SiN_x$, or $AlO_y$ or other dielectric film used for selective epitaxy.

A desired pattern can then be formed on the dielectric film which includes a substrate-dielectric film boundary substantially parallel to a <110> direction (for example, mainly along the [110] or [$\overline{1}\overline{1}0$] direction on a (001) orientation). Referring to FIG. 1, a portion 120 of dielectric film 110 can then be exposed using, for example, a combination of lithography and, dry and/or wet etching such that a substrate-dielectric film boundary 125 is substantially parallel to a <110> direction. The kinetics of faceting allow approximate alignment of the pattern direction along [110]. Depending on the length of the vertical facet along the pattern direction, however, any misalignment of the substrate-dielectric film boundary relative to the [110] orientation may lead to the formation of steps on the epitaxially grown {110} vertical planes. The effects of these steps can impact device performance. The extent to which this misalignment can be tolerated depends on the final device performance requirements.

Patterned dielectric film 110 and substrate 100 can then be cleaned and loaded in an epitaxy reactor. An epitaxial layer (epilayer) 130 shown in FIG. 2 can then be grown in exposed portion 120 of substrate 100. According to various embodiments, epitaxial layer 130 can comprise a Group III-V material or a Group IV material, such as, for example, GaAs or Si. To form {110} type sidewall facets at the substrate-dielectric film boundary, the growth mode can be selective and the growth rate can be about 2 monolayer (ML)/sec or less. In various embodiments, the growth rate may be lower than typical growth rate which is 2-4 monolayer/sec in metal-organic vapor phase epitaxy (MOVPE) and 0.3-1 monolayer/sec in molecular beam epitaxy (MBE). This is because the formation and expansion of vertical facets are affected by the surface migration of atoms incident on a patterned substrate. According to various embodiments, the growth rate can be about 0.3 mL/sec or less for MBE and about 2 monolayer/sec or less for MOVPE.

Figure 2:
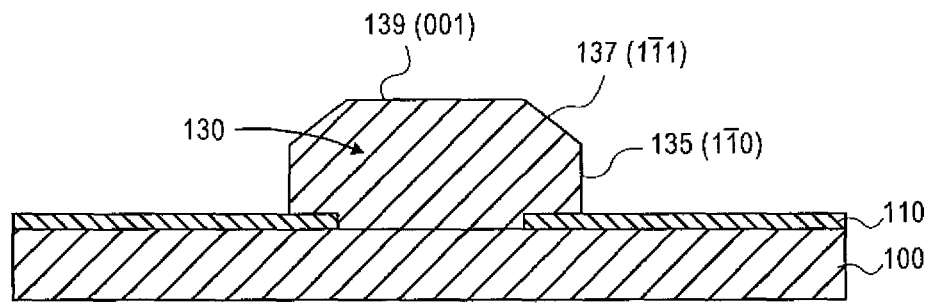
FIG. 2 depicts a cross sectional view of an epitaxial layer on a (001) oriented substrate including a vertical sidewall in accordance with various embodiments of the present teachings.
Figure 3A:
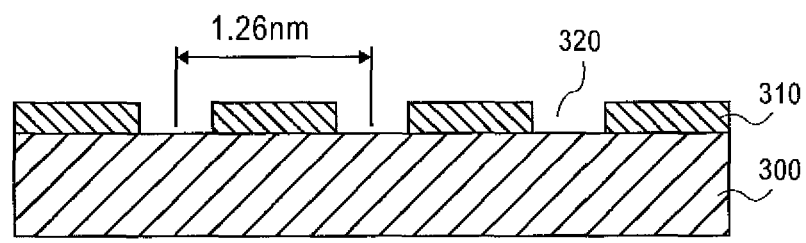
FIG. 3A depicts a cross sectional view of a patterned dielectric film on a (001) oriented substrate in accordance with various embodiments of the present teachings.
Figure 3B:
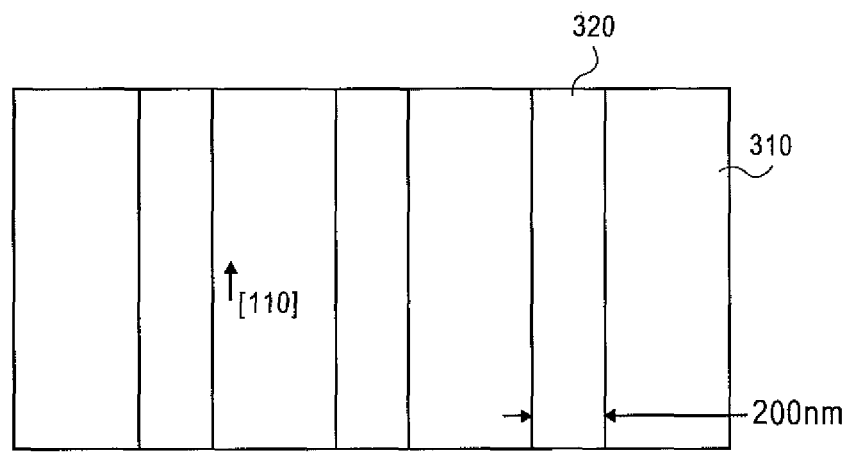
FIG. 3B depicts a top view of a plurality of stripes patterned in a dielectric film on a (001) oriented substrate in accordance with various embodiments of the present teachings.

In various embodiments, selective growth can be achieved through, for example, MBE and/or MOVPE, and/or any other epitaxy techniques. As shown in FIG. 2, selective growth on patterned substrate 100 can result in the formation of sidewall facets 135 at the boundary 125 between the substrate surface and the dielectric film, and can induce lateral growth over the dielectric film. Sidewall facets can be substantially atomically flat and perpendicular to (001) substrate 100. Such selective growth accompanies the formation of new facets near and over the dielectric film 110, providing an opportunity for the generation of sidewall facets other than {11n} type orientations. Generally, growth proceeds with the minimization of the total surface free energy and the overall shape of a selectively grown epilayer follows it with the formation of {110} type orientation facets on the sidewalls.

While not intending to be bound by any particular theory, it is believed that the vertical faceting seems to be related to a low growth rate. For example, a growth rate of about 0.2-0.3 mL/sec where vertical faceting is available can be lower than the typical growth rate of MOVPE discussed above by about an order of magnitude. The faceting associated with the vertical sidewalls at such a low deposition rate implies that the cross section of the pentagon having the vertical (110)-type sidewall facets is energetically more favorable than that of a triangle cross section having no vertical facets. In other words, the vertical faceting occurs to minimize the total surface energy under the given growth conditions. In patterned selective growth, the overall geometric shape of an epilayer is determined by faceting at the substrate-dielectric film boundary as the pattern scale is reduced to the nanoscale regime where the surface diffusion length under the given growth conditions is comparable to or greater than the physical extent of the epitaxially-grown nanostructure. Therefore, it is believed that the vertical faceting is energetically the most energy-minimized shaping under the given growth conditions.

Referring again to FIG. 2, {110} facets 135 can form above dielectric film 110. Starting on dielectric film 110, {110} facets 135 can continuously extend along the growth direction as deposition proceeds. For example, as shown in FIG. 2, epitaxial layer 130 can comprise a (1$\bar{1}$0) facet 135 that is perpendicular to the (001) substrate 100, a (1$\bar{1}$1) facet 137, and an (001) facet 139.

Once the {110} facets are formed by selective growth, the growth conditions can be altered to enhance the growth rates so long as the initial faceting is not lost. This can include transfer to another reactor if appropriate precautions are exercised (e.g., MBE to MOVPE). In MOVPE, a decrease in the growth time also can be achieved by changing the growth rate from a low value (for example, 0.1 ML/sec) to a higher value after the low growth-rate selective growth has established the {110} type facets.

In an exemplary embodiment, a grating structure was formed using the disclosed inventive methods. As schematically depicted in the side view of FIG. 3A and the top view of FIG. 3B, a dielectric film 310 was formed on a (001) substrate 300. (001) substrate was a GaAs substrate. Dielectric film 310, formed by electron beam evaporation, comprised $SiO_2$ and had a thickness, considerably smaller than that of a device structure, of about 30 nm. Patterning by i-line interferometic lithography and $CF_4$ plasma etching formed a plurality of stripes 320 having a period of about 1.26 μm and oriented in the [110] direction. One of ordinary skill in the art will understand that the period can range from nano- to micro-meter scale (for example, up to a few micrometers). For ease of illustration, only a portion of the plurality of stripes is depicted in the figures. Each of the stripes had a width of about 200 nm. To minimize the stripe width, a double exposure technique was employed. In the same photoresist layer, an ultraviolet (UV) exposure for a 420-nm period interference pattern was overlapped with another exposure for a three times larger, 1.26-μm pattern. This resulted in a significantly reduced spatial linewidth compared with that available from a single exposure at a 1.26-μm period with the same UV peak intensity.

Figure 4:
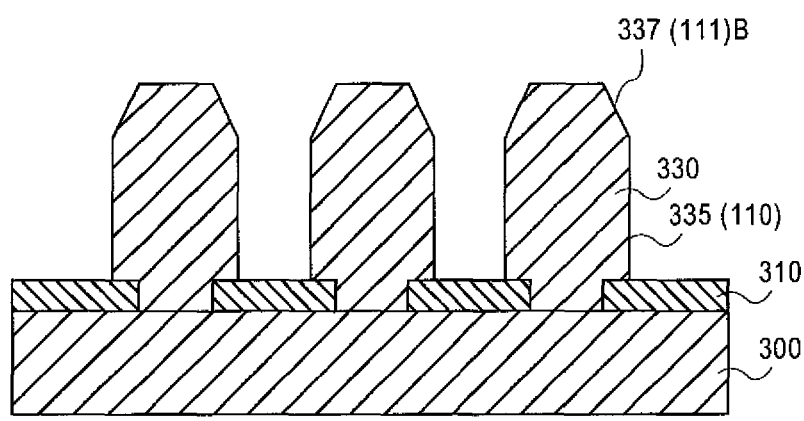
FIG. 4 depicts a cross sectional view of an epitaxially formed grating on a (001) oriented substrate including a vertical sidewall in accordance with various embodiments of the present teachings.

As schematically depicted in FIG. 4, an epitaxial layer 330 was then formed by MOVPE above each of the plurality of stripes 320. Epitaxial layers 330 had a smooth surface morphology and a height which was proportional to the deposition amount and can be increased up to a few micro-meters. Lateral growth from stripes 320 occurred partially over dielectric film 310. Such lateral growth can improve the flatness of the sidewalls (eliminating atomic steps) that are nucleated as a result of the roughness of the substrate-dielectric film boundary along the pattern direction. As shown in FIG. 4, each epitaxial layer 330 had a sidewall structure including (110) facets perpendicular to the (001) substrate and (111) B-type facets 337 near the top of each eptaxial layer structure 320. An exemplary processes using MBE to form a grating structure in accordance with the present teachings is disclosed in Epitaxial Growth of a Nanoscale, Vertically Faceted, One-Dimensional, High Aspect Ratio Grating in III-V Materials for Integrated Photonics, *Applied Physics Letters* 87, 07110 (2005), which is incorporated by reference herein in its entirety.

Fabrication of {110} type facets by epitaxial growth can be applicable, for example, to mirror facets of integrated semiconductor laser diodes, semiconductor/air distributed Bragg reflectors (DBRs), short cavity laser diodes (so-called horizontal vertical cavity surface emitting lasers (VCSELs)), and grating structures for manipulation of light propagation in solids. Nanoscale patterning can also provide fabrication of a quarter-wave-stacked distributed Bragg reflector, one and two dimensional photonic crystals for 1.3 to 1.55 μm wavelength fiber optic communications. Two examples of fabrication of {110} type facets by epitaxial growth for these types of applications, will now be provided.

According to various other embodiments, a semiconductor laser can be formed using the disclosed inventive methods. Referring to the top view of FIG. 5A and the cross sectional side view of FIG. 5B, a dielectric film 510 can be formed on a (001) oriented substrate 500. An opening 520 for a laser diode can be patterned in dielectric film 510 that exposes a portion of substrate 500, where one or more of the dielectric film-substrate boundaries are substantially parallel to a [110] direction.

Figure 5A:
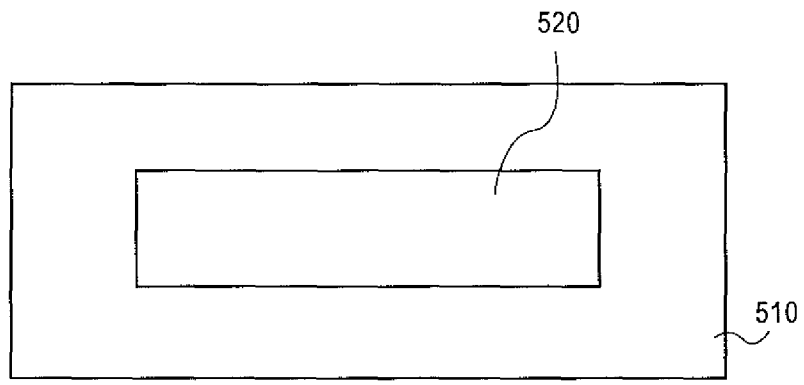
FIG. 5A depicts a top view of an opening patterned in a dielectric film on a (001) oriented substrate in accordance with various embodiments of the present teachings.
Figure 5B:
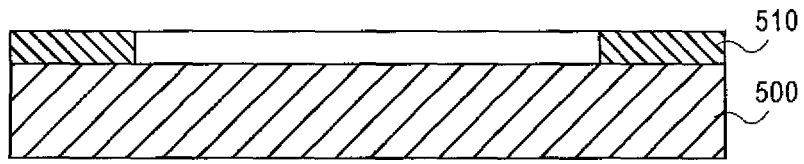
FIG. 5B depicts a cross sectional view of an opening patterned in a dielectric film on a (001) oriented substrate in accordance with various embodiments of the present teachings.
Figure 5C:
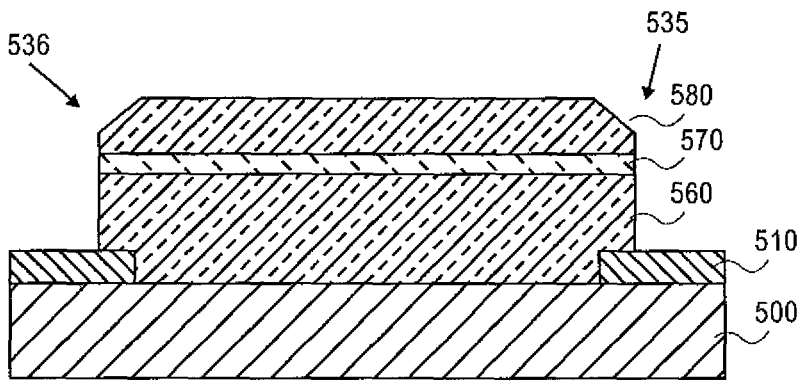
FIG. 5C depicts a cross sectional view of an epitaxially formed laser structure on an (001) oriented substrate in accordance with various embodiments of the present teachings.

The substrate 500 and patterned dielectric film 510 can then be loaded into an epitaxial reactor and a laser structure can be formed on the exposed portion of substrate 500 using the disclosed methods. Referring to FIG. 5C, the laser structure can include cladding layers 560 and 580, and an active layer 570 epitaxially grown between cladding layers 560 and 580. The active layer can include regions of lower bandgap material to provide carrier confinement including but not restricted to heterstructure quantum wells and quantum dots as is well known. Vertical sidewall facets 535 and 536 can be formed as disclosed herein and serve as cavity mirrors for the laser.

According to various other embodiments, another semiconductor laser can be formed using the disclosed inventive methods. Referring to the top view of FIG. 6A and the cross sectional side view of FIG. 6B, a first dielectric film 610 can be formed on a (001) oriented substrate 600. Two stripes 620 and 621 can then be patterned in first dielectric film 610, in a [110] orientation, such that the distance between the outer edges of stripes 620 and 621 corresponds to the cavity length of the semiconductor laser.

Figure 6A:
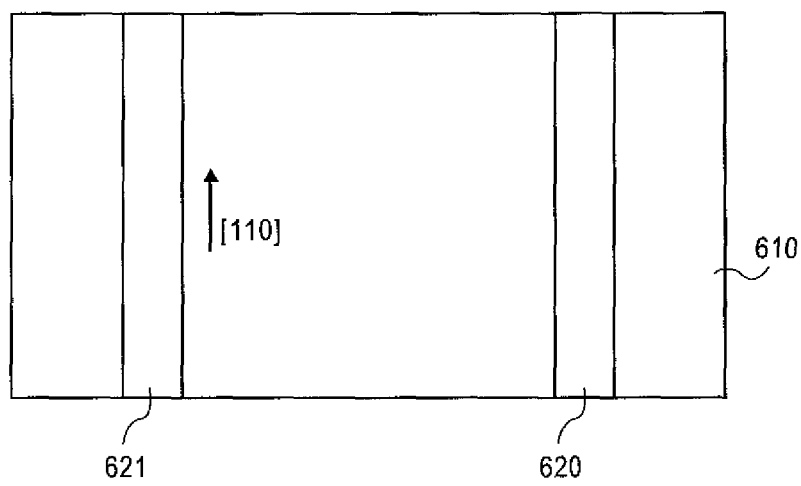
FIG. 6A depicts a top view of two stripes patterned in a dielectric film on a (001) oriented substrate in accordance with various embodiments of the present teachings.
Figure 6B:
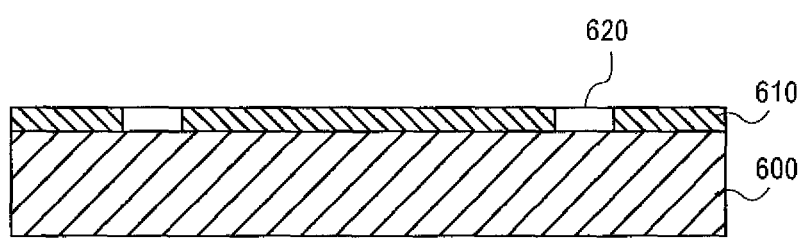
FIG. 6B depicts a cross sectional view of two stripes patterned in a dielectric film on a (001) oriented substrate in accordance with various embodiments of the present teachings.
Figure 6C:
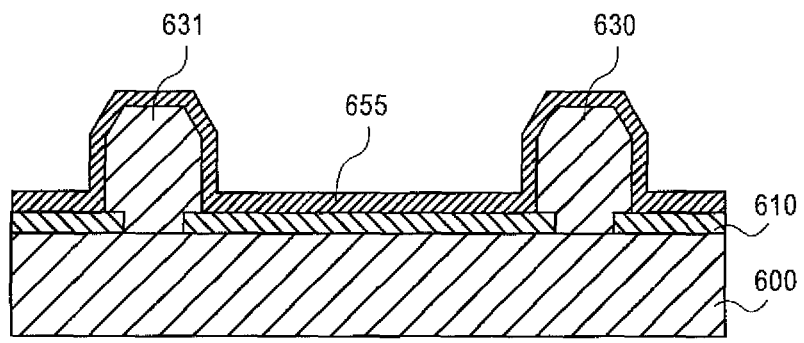
FIG. 6C depicts a cross sectional view of epitaxially formed mirrors for a laser structure on a (001) oriented substrate including dielectric films in accordance with various embodiments of the present teachings.

Substrate 600 and patterned first dielectric film 610 can then be loaded into an epitaxial reactor and epitaxial layers 630 and 631 can be formed over stripes 620 and 621, respectively. As shown in FIG. 6C, the structure of epitaxial layers 630 and 631 can comprise vertical sidewall facets. A second dielectric film 655 can then be deposited over the epitaxial layers 630 and 631 and the exposed portions of first dielectric film 610.

Figure 6D:
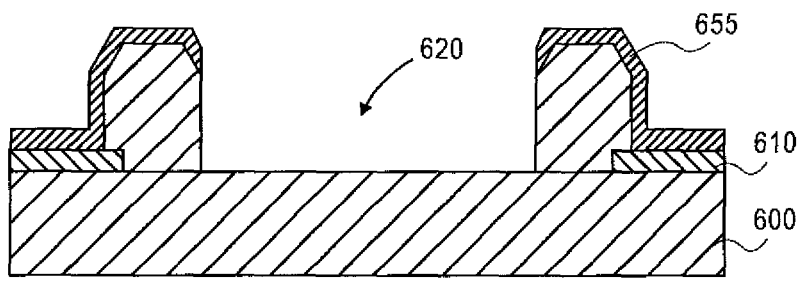
FIG. 6D depicts a cross sectional view of an epitaxially formed laser structure on a (001) oriented substrate including partially removed dielectric films in accordance with various embodiments of the present teachings.
Figure 6E:
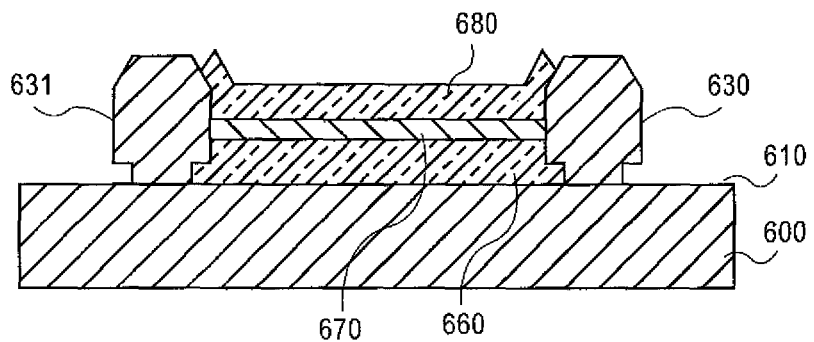
FIG. 6E depicts a cross sectional view of an epitaxially formed laser structure on a (001) oriented substrate in accordance with various embodiments of the present teachings.

Referring to FIG. 6D, an opening 620 can be formed that exposes the portion of substrate 600 between the epitaxial layers 630 and 631 by removing the corresponding portions of second dielectric film 655 and first dielectric film 610 using, for example, lithography and etching. Opening 620 can resemble, for example, opening 520 shown in FIG. 5A. In an epitaxial reactor, a laser structure can then be formed on opening 620. As shown in FIG. 6E, the laser structure can include cladding layers 660 and 680, and an active layer 670 embedded between cladding layers 660 and 680. Remaining second dielectric film 655 can also be removed. The outer facets of the epitaxial layers 630 and 631 and the structure between them can serve as cavity mirrors for the laser.

According to various other embodiments, other orientation substrates can be used to achieve facets vertical to a given substrate. In such cases, facets different from {110} can be utilized for device fabrication.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device formed using a low pressure, highly nonequilibrium epitaxial growth technique capable of forming single or nearly single atomic layers comprising:
    a substrate comprising a (001) oriented surface;
    a patterned dielectric layer disposed on the (001) oriented surface of the substrate, wherein the patterned dielectric layer exposes a portion of the substrate; and
    an epitaxial layer formed, using a low pressure, highly nonequilibrium epitaxial growth technique capable of forming single or nearly single atomic layers, on the portion of the substrate exposed by the patterned dielectric layer and formed above a portion of the patterned dielectric layer, wherein the epitaxial layer comprises a first vertical sidewall formed above the portion of the patterned dielectric layer, the first vertical sidewall comprising a {110} oriented facet and wherein the epitaxial layer and the substrate are formed of a same material, and
    wherein the epitaxial layer comprises a Group III-V material.

2. The device of claim 1, further comprising an optical resonator bounded by the first vertical sidewall and a second vertical sidewall, wherein the second vertical sidewall has an {110} orientation.

3. The device of claim 1, wherein the device is at least one of a semiconductor laser diode, a short-cavity laser diode, an optical grating, a distributed Bragg reflector, and a photonic crystal.

4. The device of claim 1, wherein the patterned dielectric layer comprises $SiO_2$.

5. The device of claim 1, wherein a substrate-dielectric layer boundary is substantially parallel to a <110> direction.

6. The device of claim 1, wherein the low-pressure, highly nonequilibrium epitaxial growth technique is molecular beam epitaxy (MBE).

7. The device of claim 1, wherein the low-pressure, highly nonequilibrium epitaxial growth technique is metal-organic vapor phase epitaxy (MOVPE).

8. The device of claim 1, wherein the Group III-V material comprises GaAs.

* * * * *